(12) United States Patent
van der Goes et al.

(10) Patent No.: US 6,583,747 B1
(45) Date of Patent: Jun. 24, 2003

(54) SUBRANGING ANALOG TO DIGITAL CONVERTER WITH MULTI-PHASE CLOCK TIMING

(75) Inventors: Franciscus Maria Leonardus van der Goes, Den Haag (NL); Jan Mulder, Houten (NL); Christopher Michael Ward, Utrecht (NL); Jan Roelof Westra, Uithoorn (NL); Rudy van de Plassche, Waalre (NL); Marcel Lugthart, Utrecht (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/158,773

(22) Filed: May 31, 2002

Related U.S. Application Data

(63) Continuation-in-part of application No. 10/153,709, filed on May 24, 2002.

(51) Int. Cl.[7] .................................. H03M 1/12
(52) U.S. Cl. ........................................ 341/156; 341/172
(58) Field of Search ............................... 341/156, 111, 341/118, 121, 133, 161, 131, 172; 348/513; 330/256

(56) References Cited

U.S. PATENT DOCUMENTS

| | | | |
|---|---|---|---|
| 5,191,336 A | * | 3/1993 | Stephenson ............ 341/111 |
| 5,302,869 A | | 4/1994 | Hosotani et al. |
| 6,259,745 B1 | | 7/2001 | Chan |

OTHER PUBLICATIONS

Miyazaki et al., "A 16mW 30MSample/s 10b Pipelined A/D Converter using a Pseudo–Differential Architecture", *ISSCC 2002/Session 10/High–Speed ADCs/10.5*, Feb. 5, 2002, 3 pgs.

Sushihara et al., "A 7b 450MSample/s 50mW CMOS ADC in 0.3 mm$^2$", *ISSCC 2002/Session 10/High–Speed ADCs/10.3*, Feb. 5, 2002, 3 pgs.

Dingwall et al., "An 8–MHz CMOS Subranging 8–Bit A/D Converter", *IEEE Journal of Solid–State Circuits*, vol. SC–20, No. 6, Dec. 1985, pp. 1138–1143.

(List continued on next page.)

*Primary Examiner*—Patrick Wamsley
(74) *Attorney, Agent, or Firm*—Sterne, Kessler, Goldstein & Fox, P.L.L.C.

(57) ABSTRACT

An N-bit analog to digital converter includes a reference ladder, a track-and-hold amplifier connected to an input voltage, a coarse ADC amplifier connected to a coarse capacitor at its input and having a coarse ADC reset switch controlled by a first clock phase of a two-phase clock, a fine ADC amplifier connected to a fine capacitor at its input and having a fine ADC reset switch controlled by a second clock phase of the two-phase clock, a switch matrix that selects a voltage subrange from the reference ladder for use by the fine ADC amplifier based on an output of the coarse ADC amplifier, and wherein the coarse capacitor is charged to a coarse reference ladder voltage during the first clock phase and connected to the T/H output during the second clock phase, wherein the fine capacitor is connected to a voltage subrange during the first clock phase and to the T/H output during the second clock phase, and an encoder that converts outputs of the coarse and fine ADC amplifiers to an N-bit output.

34 Claims, 9 Drawing Sheets

OTHER PUBLICATIONS

Abo, A.M. and Gray, P.R., "A 1.5–V, 10–bit, 14.3–MS/s CMOS Pipeline Analog–to–Digital Converter," *IEEE Journal of Solid–State Circuits,* IEEE, vol. 34, No. 5, May 1999, pp. 599–606.

Brandt, B.P. and Lutsky, J., "A 75–mW, 10–b, 20–MSPS CMOS Subranging ADC with 9.5 Effective Bits at Nyquist," *IEEE Journal of Solid–State Circuits,* IEEE, vol. 34, No. 12, Dec. 1999, pp. 1788–1795.

Bult, Klaas and Buchwald, Aaron, "An Embedded 240–mW 10–b 50–MS/s CMOS ADC in 1–mm$^2$, " *IEEE Journal of Solid–State Circuits,* IEEE, vol. 32, No. 12, Dec. 1997, pp. 1887–1895.

Cho, T.B. and Gray, P.R., "A 10 b, 20 Msample/s, 35 mW Pipeline A/D Converter," *IEEE Journal of Solid–State Circuits,* IEEE, vol. 30, No. 3, Mar. 1995, pp. 166–172.

Choe, M–J. et al., "A 13–b 40–Msample/s CMOS Pipelined Folding ADC with Background Offset Trimming," *IEEE Journal of Solid–State Circuits,* IEEE, vol. 35, No. 12, Dec. 2000, pp. 1781–1790.

Choi, M. and Abidi, A., "A 6–b 1.3–Gsample/s A/D Converter in 0.35–$\mu$m CMOS," *IEEE Journal of Solid–State Circuits,* IEEE, vol. 36, No. 12, Dec. 2001, pp. 1847–1858.

Flynn, M. and Sheahan, B., "A 400–Msample/s, 6–b CMOS Folding and Interpolating ADC," *IEEE Journal of Solid–State Circuits,* IEEE, vol. 33, No. 12, Dec. 1998, pp. 1932–1938.

Geelen, G., "A 6b 1.1GSample/s CMOS A/D Converter," IEEE International Solid–State Circuits Conference, IEEE, 2001, pp. 128–129 and 438.

Hoogzaad, G. and Roovers, R., "A 65–mW, 10–bit, 40–Msample/s BiCMOS Nyquist ADC in 0.8 mm$^2$, " *IEEE Journal of Solid–State Circuits,* IEEE, vol. 34, No. 12, Dec. 1999, pp. 1796–1802.

Hosotani, S. et al., "An 8–bit 20–MS/s CMOS A/D Converter with 50–mW Power Consumption," *IEEE Journal of Solid–State Circuits,* IEEE, vol. 25, No. 1, Feb. 1990, pp. 167–172.

Ingino, J.M. and Wooley, B.A., "A Continuously Calibrated 12–b, 10–MS/s, 3.3–V A/D Converter," *IEEE Journal of Solid–State Circuits,* IEEE, vol. 33, No. 12, Dec. 1998, pp. 1920–1931.

Ito, M. et al., "A 10 bit 20 MS/s 3 V Supply CMOS A/D Converter," *IEEE Journal of Solid–State Circuits,* IEEE, vol. 29, No. 12, Dec. 1994, pp. 1531–1536.

Kattman, K. and Barrow, J., "A Technique for Reducing Differential Non–Linearity Errors in Flash A/D Converters," *IEEE International Solid–State Conference,* IEEE, 1991, pp. 170–171.

Kusumoto, K. et al., "A 10–b 20–MHz 30–mW Pipelined Interpolating CMOS ADC," *IEEE Journal of Solid–State Circuits,* IEEE, vol. 28, No. 12, Dec. 1993, pp. 1200–1206.

Lewis, S. et al., "A 10–b 20–Msample/s Analog–to–Digital Converter," *IEEE Journal of Solid–State Circuits,* IEEE, vol. 27, No. 3, Mar. 1992, pp. 351–358.

Mehr, I. and Singer, L., "A 55–mW, 10–bit, 40–Msample/s Nyquist–Rate CMOS ADC," *IEEE Journal of Solid–State Circuits,* IEEE, vol. 35, No. 3, Mar. 2000, pp. 318–325.

Nagaraj, K. et al., "Efficient 6–Bit A/D Converter Using a 1–Bit Folding Front End," *IEEE Journal of Solid–State Circuits,* IEEE, vol. 34, No. 8, Aug. 1999, pp. 1056–1062.

Nagaraj, K. et al., "A Dual–Mode 700–Msamples/s 6–bit 200–Msamples/s 7–bit A/D Converter in a 0.25–$\mu$m Digital CMOS," *IEEE Journal of Solid–State Circuits,* IEEE, vol. 35, No. 12, Dec. 2000, pp. 1760–1768.

Nauta, B. and Venes, A., "A 70–MS/s 110–mW 8–b CMOS Folding and Interpolating A/D Converter," *IEEE Journal of Solid–State Circuits,* IEEE, vol. 30, No. 12, Dec. 1995, pp. 1302–1308.

Pan, H. et al., "A 3.3–V 12–b 50–MS/s A/D Converter in 0.6–$\mu$m CMOS with over 80–dB SFDR," *IEEE Journal of Solid–State Circuits,* IEEE, vol. 35, No. 12, Dec. 2000, pp. 1769–1780.

Song, W–C. et al., "A 10–b 20–Msample/s Low–Power CMOs ADC," *IEEE Journal of Solid–State Circuits,* IEEE, vol. 30, No. 5, May 1995, pp. 514–521.

Sumanen, L. et al., "A 10–bit 200–MS/s CMOS Parallel Pipeline A/D Converter," *IEEE Journal of Solid–State Circuits,* IEEE, vol. 36, No. 7, Jul. 2001, pp. 1048–1055.

Taft, R.C. and Tursi, M.R., "A 100–MS/s 8–b CMOS Subranging ADC with Sustained Parametric Performance from 3.8 V Down to 2.2 V," *IEEE Journal of Solid–State Circuits,* IEEE, vol. 36, No. 3, Mar. 2001, pp. 331–338.

van der Ploeg, H. and Remmers, R., "A 3.3–V, 10–b 25–Msample/s Two–Step ADC in 0.35–$\mu$m CMOS," *IEEE Journal of Solid–State Circuits,* IEEE, vol. 34, No. 12, Dec. 1999, pp. 1803–1811.

van der Ploeg, H. et al., "A 2.5–V 12–b 54–Msample/s 0.25–$\mu$m CMOS ADC in 1–mm$^2$ With Mixed–Signal Chopping and Calibration," *IEEE Journal of Solid–State Circuits,* IEEE, vol. 36, No. 12, Dec. 2001, pp. 1859–1867.

Vorenkamp, P. and Roovers, R., "A 12–b, 60–Msample/s Cascaded Folding and Interpolating ADC," *IEEE Journal of Solid–State Circuits,* IEEE, vol. 32, No. 12, Dec. 1997, pp. 1876–1886.

Wang, Y–T. and Razavi, B., "An 8–bit 150–MHz CMOS A/D Converter," *IEEE Journal of Solid–State Circuits,* IEEE, vol. 35, No. 3, Mar. 2000, pp. 308–317.

Yotsuyanagi, M. et al., "A 2 V, 10 b, 20 Msample/s, Mixed–Mode Subranging CMOS A/D Converter," *IEEE Journal of Solid–State Circuits,* IEEE, vol. 30, No. 12, Dec. 1995, pp. 1533–1537.

Yu, P.C. and Lee, H–S., "A 2.5–V, 12–b, 5–Msample/s Pipelined CMOS ADC," *IEEE Journal of Solid–State Circuits,* IEEE, vol. 31, No. 12, Dec. 1996, pp. 1854–1861.

* cited by examiner

US 6,583,747 B1

SUBRANGING ANALOG TO DIGITAL CONVERTER WITH MULTI-PHASE CLOCK TIMING

CROSS-REFERENCE TO RELATED APPLICATIONS

This application is a Continuation-in-Part of application Ser. No. 10/153,709, Filed: May 24, 2002, Titled: Distributed Averaging Analog To Digital Converter Topology, Inventors: Mulder et al.; and is related to application Ser. No. 10/158,774, Filed: May 31, 2002; Titled: Analog To Digital Converter With Interpolation Of Reference Ladder, Inventors: Mulder et al.; Application Ser. No. 10/158,595, Filed: May 31, 2002, Titled: HIGH SPEED ANALOG TO DIGITAL CONVERTER, Inventor: Jan Mulder; and application Ser. No. 10/158,193, Filed: May 31, 2002, Inventor: Jan Mulder; Titled: CLASS AB DIGITAL TO ANALOG CONVERTER/LINE DRIVER, Inventors: Jan Mulder et al.; all of which are incorporated by reference herein.

BACKGROUND OF THE INVENTION

1. Field of the Invention

The present invention relates to analog to digital converters ADC, and more particularly, to analog to digital converters utilizing track-and-hold amplifiers for high speed operation.

2. Related Art

A subranging analog to digital converter (ADC) architecture is suitable for implementing high-performance ADC's (i.e. high speed, low power, low area, high resolution). FIG. 1 shows the generic two-step subranging architecture, comprising a reference ladder 104, a coarse ADC 102, a switching matrix 103, a fine ADC 105, coarse comparators (latches) 107, fine comparators (latches) 108 and an encoder 106. In inmost cases, a track-and-hold 101 is used in front of the ADC. In this architecture, an input voltage is first quantized by the coarse ADC 102. The coarse ADC 102 and the coarse comparators 107 compare the input voltage against all the reference voltages, or against a subset of the reference voltages that is uniformly distributed across the whole range of reference voltages. Based on a coarse quantization, the switching matrix 103 connects the fine ADC 105 and the fine comparators 108 to a subset of the reference voltages (called a "subrange") that is centered around the input signal voltage. The coarse and fine comparators 107, 108 latch the outputs of the coarse and fine ADC's 102, 105 prior to inputting them to the encoder 106.

High-speed high-resolution ADC's usually use a track-and-hold (T/H) or a sample-and-hold (S/H) preceding the ADC. The main distinction between a S/H and a T/H is that a S/H holds the sampled input signal for (almost) a full clock period, whereas a T/H holds the sampled input signal for (almost) half a clock period.

In general, a S/H requires more area and power than a T/H to obtain the same performance. However, the disadvantage of a T/H is that the sampled input signal is available to the ADC for only half a clock period.

Other subranging ADC's are known that can use a T/H instead of a S/H. However, the timing proposed in conventional art has important disadvantages.

Typically, both the coarse and fine ADC amplifiers reset to the T/H output voltage. This leaves much less time available for the coarse ADC amplifiers to amplify the signals and the coarse comparators to decide on a voltage to latch. This will impact a maximum sampling speed $F_{sample}$ that the ADC can run at.

Some ADC's use a T/H, where the same physical circuits are used for performing both the coarse and the fine quantization. This leaves only ¼ of a clock cycle available for performing the coarse quantization, or two timeinterleaved sub-ADC's have to be used. This impacts either maximum possible operating speed, or doubles required area and power.

Thus, one of the bottlenecks in subranging ADC's is the limited amount of time available for performing the coarse quantization. Several different timing methods for subranging ADC's are known for optimizing this bottleneck. Unfortunately, most of these solutions require the use of a S/H, or use time-interleaved ADC's. This disadvantageously affects the required power and area.

SUMMARY OF THE INVENTION

The present invention is directed to an analog to digital converter that substantially obviates one or more of the problems and disadvantages of the related art.

There is provided an N-bit analog to digital converter including a reference ladder, a track-and-hold amplifier connected to an input voltage, and a coarse ADC amplifier connected to a coarse capacitor at its input and having a coarse ADC reset switch controlled by a first clock phase of a two-phase clock. A fine ADC amplifier connected to a fine capacitor at its input and has a fine ADC reset switch controlled by a second clock phase of the two-phase clock. A switch matrix selects a voltage subrange from the reference ladder for use by the fine ADC amplifier based on an output of the coarse ADC amplifier. The coarse capacitor is charged to a coarse reference ladder voltage during the first clock phase and connected to the T/H output voltage during the second clock phase, wherein the fine capacitor is connected to a voltage subrange during the first clock phase and to the T/H output voltage during the second clock phase. An encoder converts outputs of the coarse and fine ADC amplifiers to an N-bit output.

In another aspect of the present invention there is provided an N-bit analog to digital converter including a reference ladder, a track-and-hold amplifier tracking an input voltage, a two-phase clock having phases $\phi_1$ and $\phi_2$, and a plurality of coarse ADC amplifiers each connected to a corresponding coarse capacitor at its input. The coarse ADC amplifiers are reset on $\phi_1$ and their corresponding coarse capacitors are connected to the T/H output voltage on $\phi_2$. A plurality of fine ADC amplifiers are each connected to a corresponding fine capacitor at their input. The fine ADC amplifiers are reset on $\phi_2$ and their corresponding fine capacitors are charged to the T/H output voltage on $\phi_2$. A switch matrix selects a voltage subrange from the reference ladder based on outputs of the coarse ADC amplifiers for input to the fine ADC amplifiers on $\phi_1$. An encoder converts outputs of the coarse and fine ADC amplifiers to an N-bit output.

In another aspect of the present invention there is provided a N-bit analog to digital converter including a reference ladder, a track-and-hold amplifier tracking an input voltage, a two-phase clock having phases $\phi_1$ and $\phi_2$, a coarse capacitor connected to the track-and-hold amplifier on $\phi_2$ and to the reference ladder on $\phi_1$, a coarse ADC amplifier that resets on $\phi_1$ and amplifies a voltage on the coarse capacitor on $\phi_2$, and a coarse comparator for latching an output of the coarse ADC amplifier on $\phi_{1+1\ cycle}$. A fine capacitor is connected to the track-and-hold on $\phi_2$ and to a fine voltage tap of the reference ladder on $\phi_1$, the fine voltage tap selected based on the output of the coarse ADC amplifier.

A fine ADC amplifier includes a plurality of cascaded amplifier stages. A first cascaded amplifier stage resets on $\phi_2$ and amplifies a voltage on the fine capacitor on $\phi_{1+1\ cycle}$, a second cascaded amplifier stage resets on $\phi_{1+1\ cycle}$ and amplifies the voltage on the fine capacitor on $\phi_{2+1\ cycle}$, a third cascaded amplifier stage resets on $\phi_{2+1\ cycle}$, cycle and amplifies the voltage on the fine capacitor on $\phi_{1+2\ cycles}$, and so on. A fine comparator latches an output of a last cascaded amplifier stage on $\phi_{1+3\ cycle}$, and an encoder converts outputs of the coarse and fine comparators to an N-bit output.

In another aspect of the present invention there is provided an N-bit analog to digital converter including a reference ladder, a track-and-hold amplifier tracking an input voltage, a two-phase clock having alternating phases $\phi_1$ and $\phi_2$, a plurality of coarse capacitors connected to an output of the track-and-hold on $\phi_2$ and to corresponding coarse taps of the reference ladder on $\phi_1$, and a plurality of coarse ADC amplifiers that reset on $\phi_1$ and amplify voltages on the coarse capacitors on $\phi_2$. A plurality of coarse comparators latches outputs of the coarse ADC amplifiers. A plurality of fine capacitors connected to the output of track-and-hold amplifier on $\phi_2$ and connected to fine voltage taps of the reference ladder on $\phi_1$, the fine voltage taps are selected based on the outputs of the coarse ADC amplifiers. A plurality of fine ADC amplifiers, each including a plurality of cascaded amplifier stages. The cascaded amplifier stages reset and amplify on alternating phases $\phi_1$ and $\phi_2$, wherein amplifiers of the first stage are reset on $\phi_2$ and amplify voltages of the fine capacitors on $\phi_1$, a plurality of fine comparators for latching outputs of a last amplifier stage. An encoder converts outputs of the coarse and fine comparators to an N-bit output.

Additional features and advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

This disclosure describes a subranging ADC that uses a two-phase clock timing method that permits the use of a T/H instead of a S/H, thus enabling a low-power, low-area implementation on a chip. The timing technique described herein can use a T/H, instead of a S/H, and does not require time-interleaved ADC's in order to realize high-speed operation.

Figure 1:
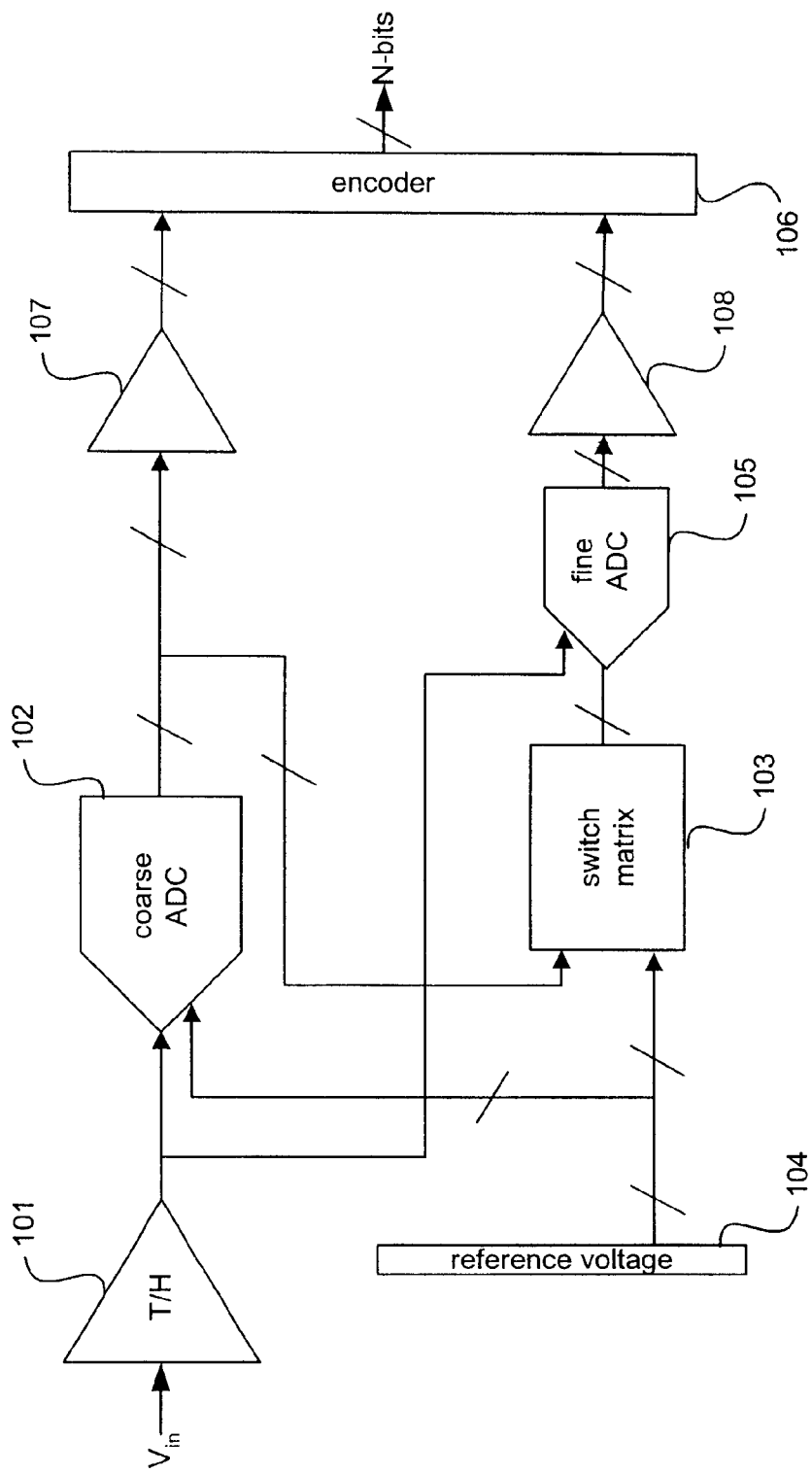
FIG. 1 illustrates a conventional subranging ADC architecture.
Figure 2:
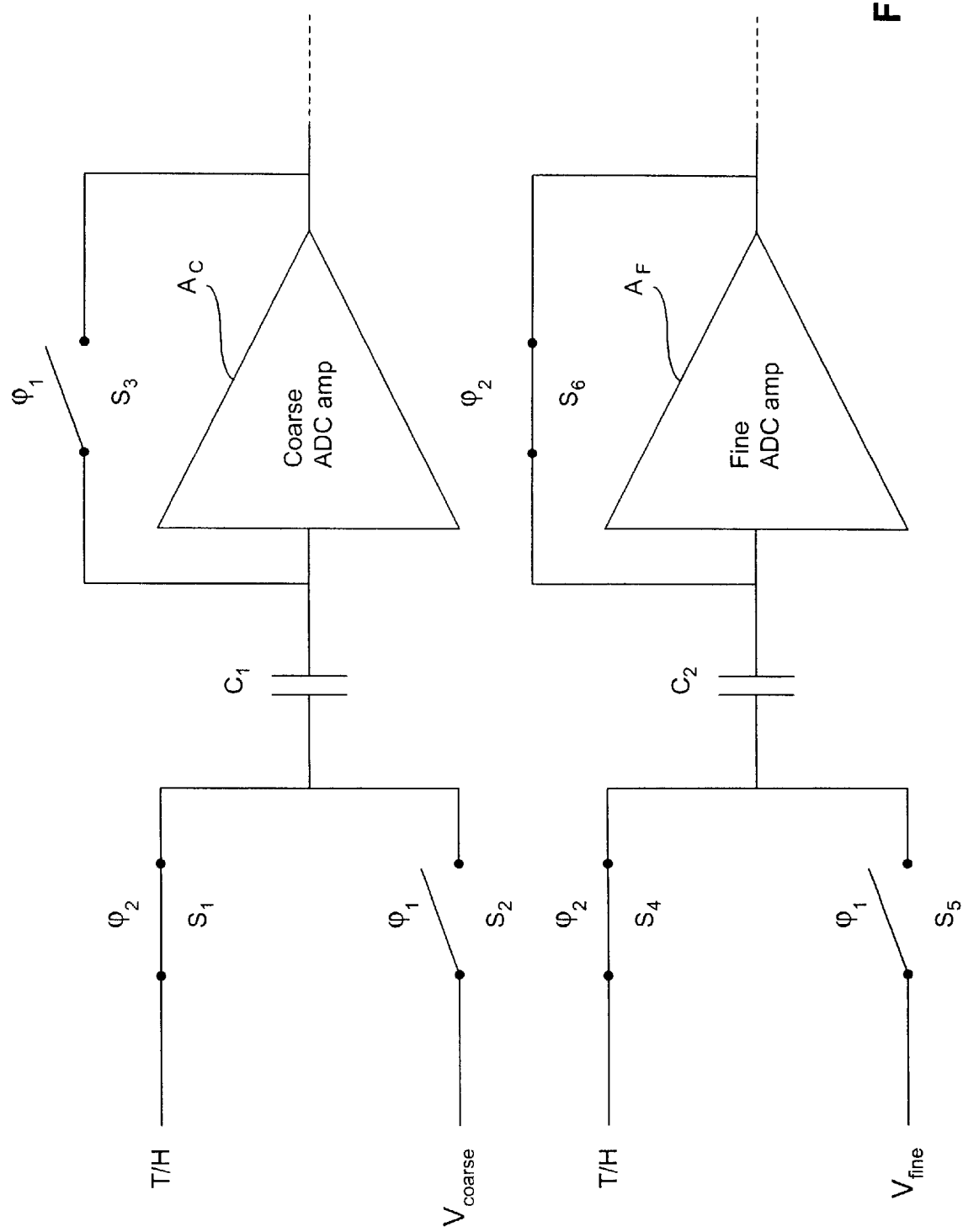
FIG. 2 illustrates connections of one set of amplifiers of the present invention.

FIG. 2 shows a single coarse amplifier $A_C$ and a single fine amplifier $A_F$ that illustrate the proposed timing method of the present invention. Preferably, the coarse amplifier $A_C$ and the fine amplifier $A_F$ are implemented using auto-zero amplifiers. See, e.g., http://www.web-ee.com/primers/files/auto-zero amps.pdf, for a general discussion of auto-zero amplifiers. (To the extent the overall block diagram of the architecture is the same as that in FIG. 1, the same reference labels will be used herein. It is also understood that the coarse ADC 102 and the fine ADC 105 actually include an array of coarse amplifiers and an array of fine amplifiers. See, e.g., *The Circuits and Filters Handbook,* Wai-Kai Chen, ed., 1995, at 2099, for a discussion of subranging ADC's. See also FIGS. 8 and 9, and discussion below.

In one embodiment, 30 coarse amplifiers, 30 coarse comparators, 19 fine amplifiers and 65 fine comparators are used.) The coarse amplifier $A_C$ is connected to a capacitor $C_1$, which in turn is connected to either the output of a track-and-hold 101, or to $V_{coarse}$ from the reference ladder 104. A two-phase clock, including phases $\phi_1$ and $\phi_2$, is used to control switches $S_1$, $S_2$ and $S_3$ of the coarse amplifier $A_C$. When the phase $\phi_1$ is on, the switches $S_2$ and $S_3$ are closed, the switch $S_1$ is open. With the switch $S_3$ closed, the coarse ADC amplifier $A_C$ is in a reset mode, and the capacitor $C_1$ is connected to the reference ladder tap $V_{coarse}$. Also on $\phi_1$, the switch $S_5$ is closed, the switches $S_4$ and $S_6$ are open, and the fine capacitor $C_2$ is connected to an appropriate tap of the reference ladder $V_{fine}$. Note that all of the switches as $S_1$–$S_6$ are typically field effect transistor (FET) switches. The switch $S_3$ may be referred to as a coarse ADC reset switch, nand the switch $S_6$ may be referred to as a fine ADC reset switch. When the phase $\phi_1$ of the two-phase clock is on, the switches $S_3$ and $S_2$ are closed, the amplifier $A_C$ is in a reset mode, and the left side of the capacitor $C_1$ is connected to a tap of the reference ladder (i.e., $V_{coarse}$). The switch $S_1$ is open when $\phi_1$ is on.

On the opposite phase of the two-phase clock ($\phi_2$), when $\phi_2$ is high, the switch $S_1$ is closed, the switches $S_2$ and $S_3$ are open. The switches $S_4$ and $S_6$ are closed, and the fine amplifier. $A_F$ is in reset mode. Therefore the capacitor $C_1$ is connected to the track-and-hold output, and the amplifier $A_C$ is in an amplify mode when the clock phase $\phi_2$ is on.

Thus, the operation of the fine ADC amplifier $A_F$ may be thought of as an inverse of the operation of the amplifier $A_C$. In other words, when the clock phase $\phi_2$ is on, the left side of the capacitor $C_2$ is connected to the track-and-hold through switch $S_4$, and the amplifier $A_F$ is in the reset mode, since the switch $S_6$ is closed, and the switch $S_5$ is open. When the clock phase $\phi_1$ is on, a switch $S_5$ is closed to connect the capacitor $C_2$ to $V_{fine}$, (a subrange from the reference ladder 104), the switches $S_4$ and $S_6$ are open, and the amplifier $A_F$ is in the amplify mode. The capacitors $C_1$ and $C_2$ are typically 50 to 200 femtofarads.

During the clock phase $\phi_1$, the coarse amplifiers $A_C$ are reset to the reference ladder 104, while the fine amplifiers $A_F$ amplify the previous sample. During the clock phase $\phi_2$, the coarse amplifiers $A_C$ amplify the next sample, while the fine amplifiers $A_F$ reset to the next sample.

Thus, there is no need to use a sample and hold amplifier, which uses one clock period for the operation of the coarse ADC 102, and one clock period for the operation of the fine ADC 105. With the arrangement shown in FIG. 2, the fine ADC amplifier $A_F$ has a half cycle latency compared to the coarse ADC amplifier $A_C$. Thus, one half of a clock cycle is available to do coarse quantization (and ½ cycle is available for fine quantization). During the reset phase, the auto-zero amplifiers can be connected either to the T/H or to a reference voltage. An important difference between these two possibilities is that resetting all amplifiers to a reference voltage requires half a clock cycle less latency in comparison with resetting to the T/H output voltage.

Therefore, if the coarse ADC amplifiers $A_C$ are reset to a tap of the reference ladder 104, and the fine ADC amplifiers $A_F$ are reset to the T/H 101, half a clock cycle now becomes available for performing the coarse quantization. (See also flowcharts in FIG. 6 and FIG. 7) Because a S/H is not needed with this timing approach, the resulting ADC can be more area- and power-efficient.

The coarse ADC amplifier $A_C$ has one half of a clock cycle to set switches in the switch matrix 103, in order for the switch matrix 103 to pass the correct $V_{fine}$ reference ladder 104 output to the fine ADC 105. While the amplifiers $A_C$ and $A_F$ require two phases to operate, the capacitors $C_1$ and $C_2$ subtract the $V_{coarse}$ from the track-and-hold output, or $V_{fine}$ from the track-and-hold output, respectively.

Phrased another way, there are two steps involved in the process:

1) Charge $C_1$, while the amplifier $A_C$ is in a reset mode, and the amplifier $A_C$ is providing a low impedance so that $C_1$ can be charged.
2) Release the reset, tie the capacitor $C_1$ to the amplifier $A_C$ in order for it to amplify the track-and-hold output.

Thus, the track-and-hold 101 only outputs the signal for half a period, and $C_1$ is charged early, before the track-and-hold 101 is ready. When the track-and-hold 101 is ready, the amplifier $A_C$ immediately does the amplification.

Although FIG. 2 shows only one coarse amplifier and one fine ADC amplifier $A_F$, each can be part of an array of amplifiers in one embodiment of the invention. The amplifiers connect to the T/H during one half clock cycle, and to reference voltage taps ($V_{coarse}$ or $V_{fine}$) from the reference ladder 104 during a second half clock cycle.

The amplifiers $A_C$ and $A_F$ are typically differential pair auto-zero amplifiers, with resistive load, preferably done in CMOS technology, e.g., NMOS or PMOS. Alternatively, the amplifiers $A_C$ and $A_F$ can be fabricated using bipolar technology.

Figure 3:
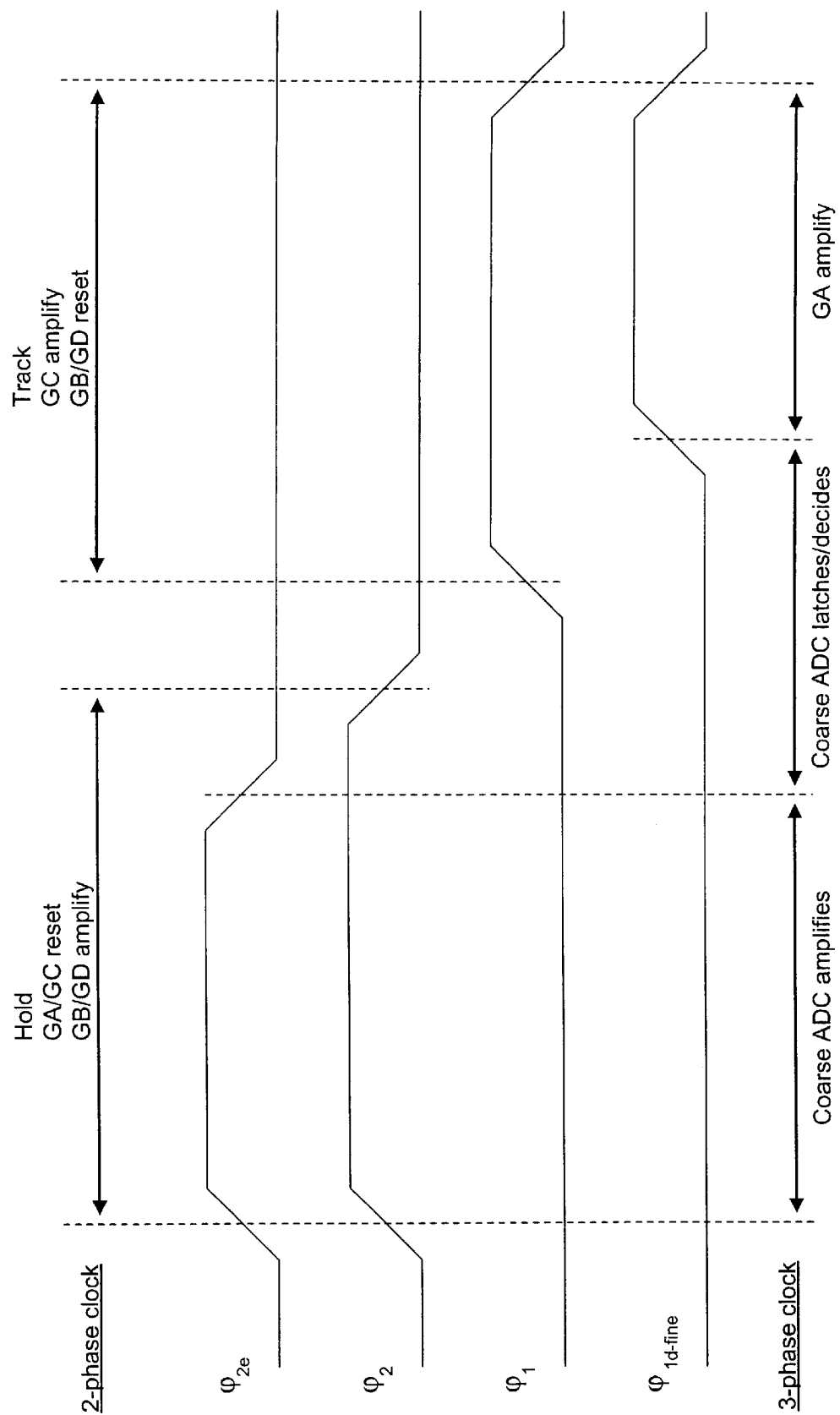
FIG. 3 illustrates a timing diagram for operation of the circuit of FIG. 2.

FIG. 3 shows how a two-phase non-overlapping clock can be converted to a three phase clock to better fine tune the ability of the coarse and fine amplifiers $A_C$, $A_F$ and the comparators 107, 108 settle to their final values. As shown in FIG. 3 (and the flowcharts of FIGS. 6 and 7), the phase $\phi_2$ can be split up into $\phi_2$ and $\phi_{2e}$, where $\phi_{2e}$ represents an early falling edge of the clock phase $\phi_2$. Similarly, $\phi_1$ can be used to generate a phase $\phi_{1d\_fine}$, a delayed $\phi_1$ phase of the clock used by the fine ADC 105. As illustrated by the notations at the top and bottom of FIG. 3, the coarse ADC amplifier $A_C$ starts amplifying on the rising edge of $\phi_{2e}$, and stops amplifying on the falling edge of $\phi_{2e}$. The fine ADC amplifier $A_F$ is in a reset mode during that phase.

During the next phase of the clock, the coarse amplifier $A_C$ begins resetting on the rising edge of $\phi_1$, and stops resetting on the falling edge of $\phi_1$. The comparators 107 of the coarse ADC 102 have from between the falling edge of $\phi_{2e}$ through the rising edge of $\phi_{1d\_fine}$ to decide on whether they are latching 1 or 0 by comparing to a reference voltage from the reference ladder 104. (Each fine amplifier $A_F$ is actually a cascade of amplifiers, GA, GB, GC, GD, as discussed below, and which is particularly useful in a pipelined architecture. The first amplifier in the cascade, GA, amplifies between the rising edge of $\phi_{1d\_fine}$ through the falling edge of $\phi_{1d\_fine}$.)

Figure 4:
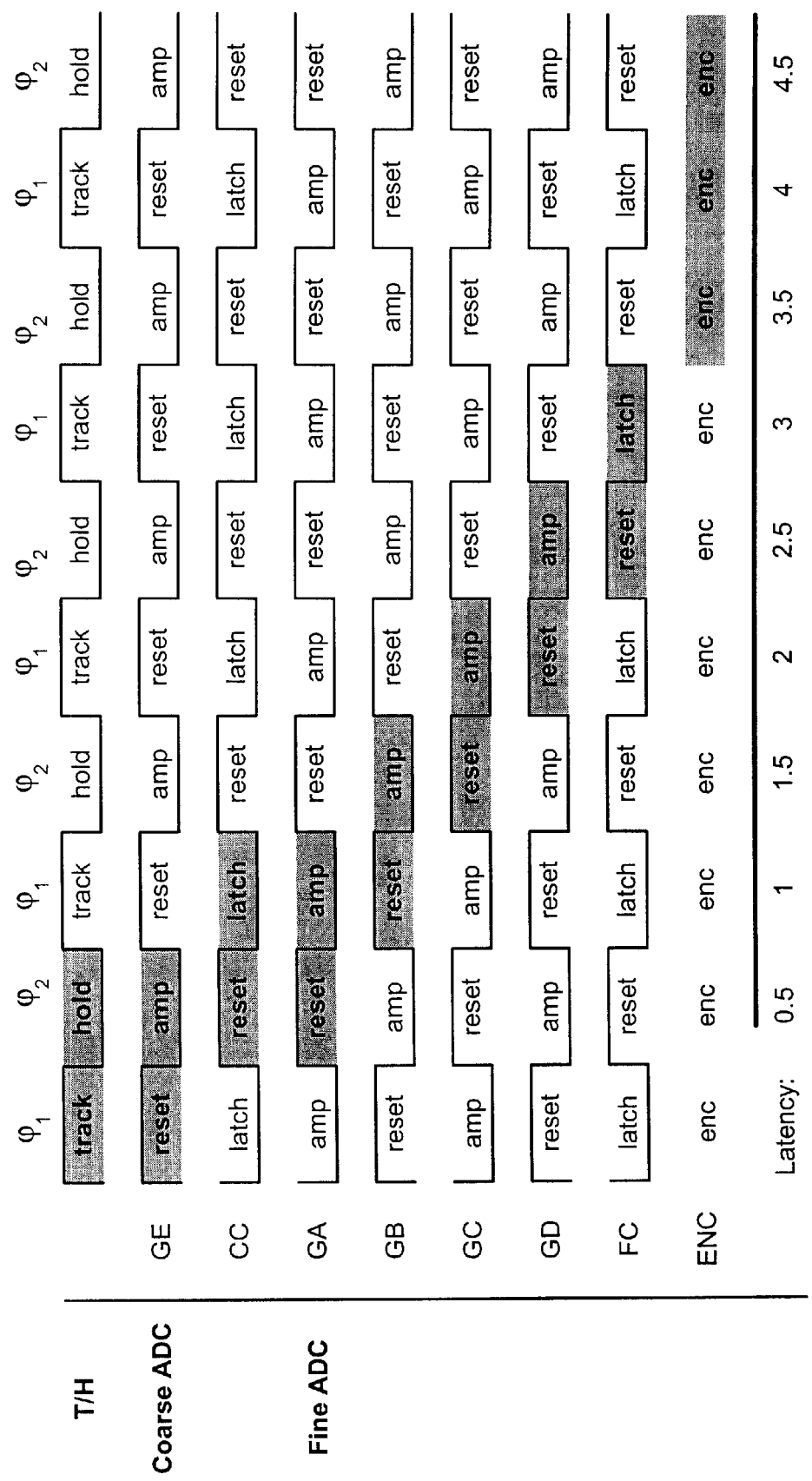
FIG. 4 shows a pipelined timing diagram for the present invention.

FIG. 4 further illustrates the operation of the amplifiers of the present invention in a situation where the fine ADC 105 has 4 cascaded stages (typically with a gain of 4× each), which are labeled GA, GB, GC and GD. In FIG. 4, the amplifier stage of the coarse ADC 102 is labeled GE, the coarse ADC comparator 107 is labeled CC, the fine ADC comparator 108 is labeled FC and the encoder is labeled ENC. The gray portions of FIG. 4 illustrate a progression of one sample's quantization down the amplifier cascade. First, the track-and-hold 101 is connected to the coarse ADC amplifier $A_C$, during phase $\phi_2$. Meanwhile, the coarse comparator 107 (CC) is reset during $\phi_2$. The fine ADC amplifier $A_F$ stage GA is also reset. During the next phase $\phi_1$, the first stage GA of the fine ADC 105 amplifies, while the second stage GB resets. The process continues, as the signal moves in a pipelined manner down from GA to GB to GC to GD to the fine comparator 108 (FC), and ultimately to the encoder 106. The next quantization is directly behind the quantization just performed, moving from left to right in the figure, and offset by one clock cycle from the measurement illustrated in gray in FIG. 4.

Figure 5:
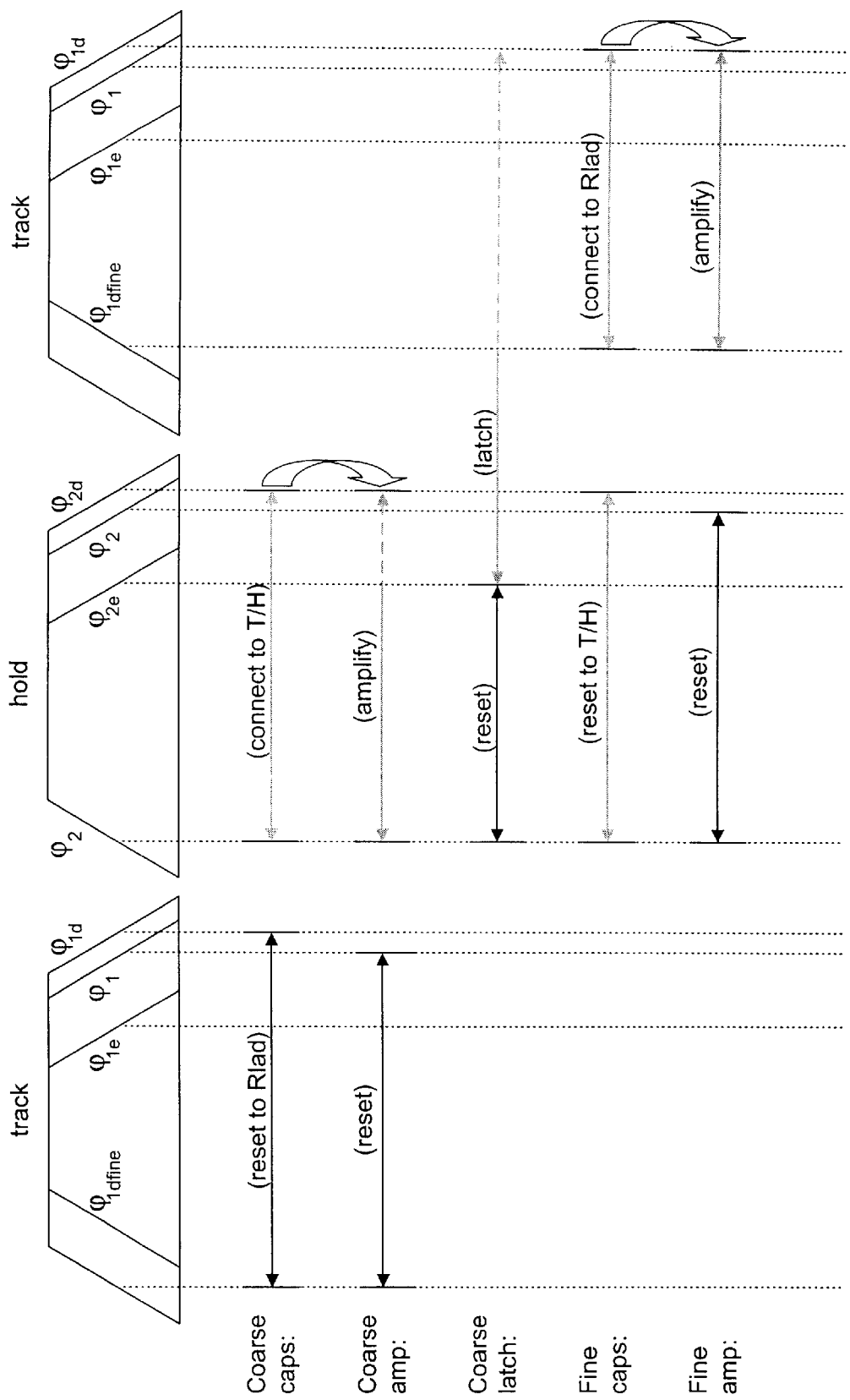
FIG. 5 shows the timing diagram of the present invention in additional detail.
Figure 6:
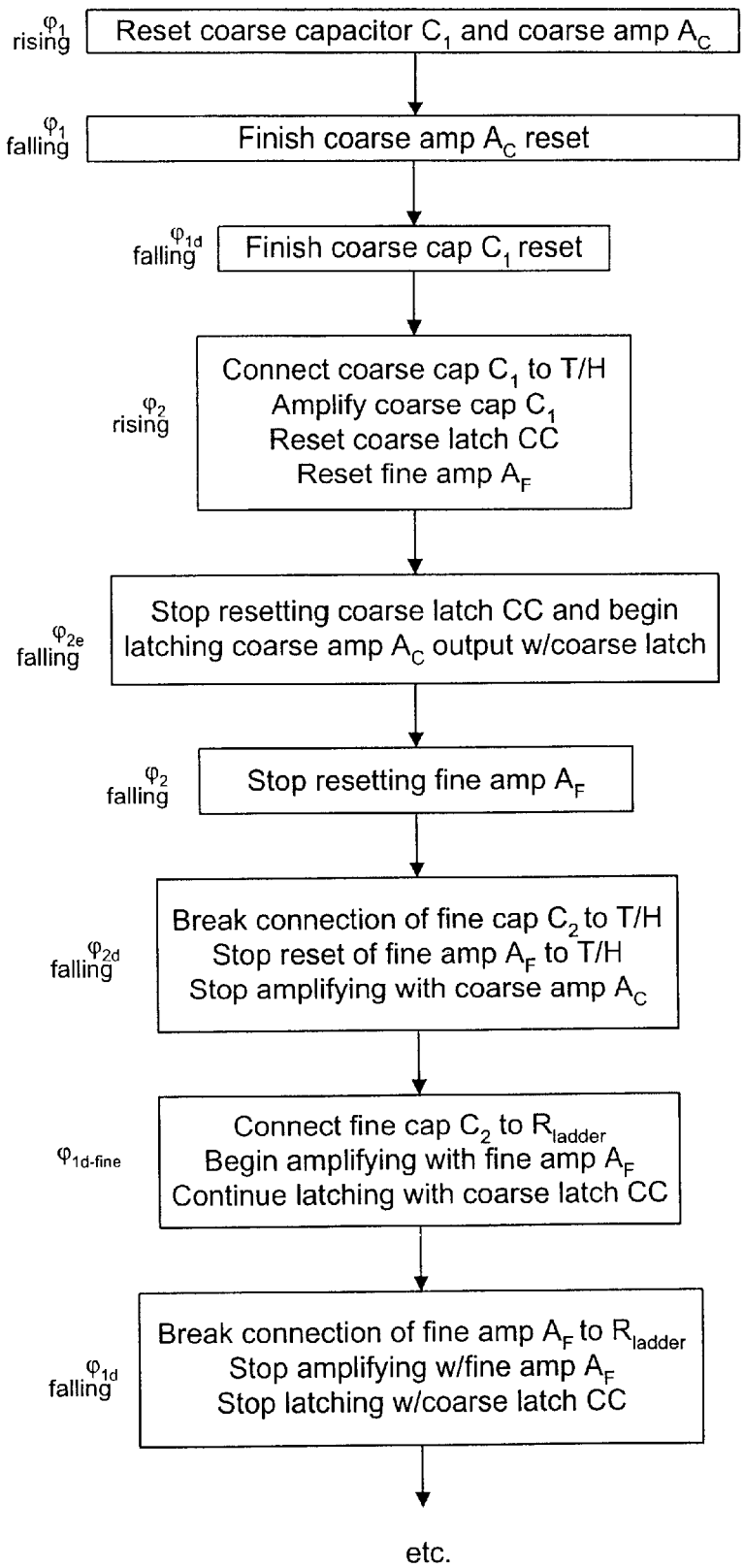
FIGS. 6 and 7 show a flow chart for the timing diagram of FIG. 5.
Figure 7:
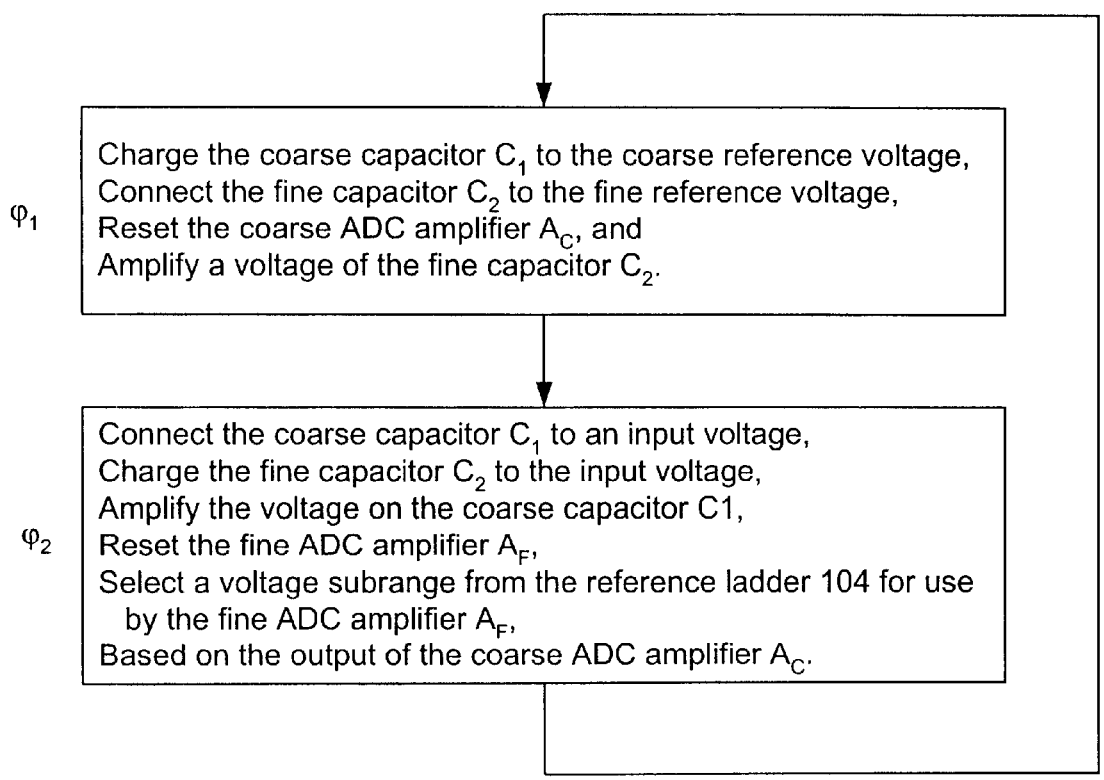

FIGS. 5 and 6 illustrates the operation of the coarse/fine ADC's 102/105 in greater detail, showing the relationship between the clock phases of the three phase clock discussed above, and the operation of the various components shown in FIG. 2. As may be seen from FIGS. 5 and 6, the coarse capacitor $C_1$ is connected to the reference ladder 104 voltage $V_{ref}$ (i.e., $V_{coarse}$) on the rising edge of the clock phase $\phi_1$. The coarse amplifier 102 is also reset on the rising edge of $\phi_1$, with the switch $S_3$ being closed until the falling edge of $\phi_1$. The switch $S_2$ is kept closed until the falling edge of $\phi_{1d}$ (the delayed edge of $\phi_1$).

On the rising edge of $\phi_2$, the coarse capacitor $C_1$ is connected to the track-and-hold 101, and the coarse amplifier $A_C$ begins amplifying the signal. The coarse comparator 107 (CC) is reset on the rising edge of $\phi_2$, and the fine capacitor $C_2$ is connected to the track-and-hold voltage. The fine amplifier $A_F$ is also reset on the rising edge of $\phi_2$. The coarse capacitor $C_1$ is connected to the track-and-hold 101 until the falling edge of $\phi_{2d}$ (for delayed $\phi_2$), the coarse comparator 107 (CC) begins latching at the falling edge of $\phi_{2e}$ (for early $\phi_2$) and the fine amplifier $A_F$ continues to be reset until the falling edge of $\phi_2$. The fine capacitor $C_2$ is connected to the T/H through the delayed falling edge of($P_2$ ($\phi_{2d}$).

On the next half clock cycle $\phi_1$, the coarse comparator 107 (CC) is assumed to have latched at the rising edge of $\phi_{1d\_fine}$, while the fine capacitor $C_2$ is connected to the reference voltage and fine amplifier $A_F$ begins to amplify, also on the rising edge of $\phi_{1d\_fine}$. The connection of the capacitor $C_2$ to the reference ladder 104 lasts until the falling edge of $\phi_{1d}$, and the fine amplifier $A_F$ stops amplifying on the falling edge of $\phi_{1d}$.

Figure 8:
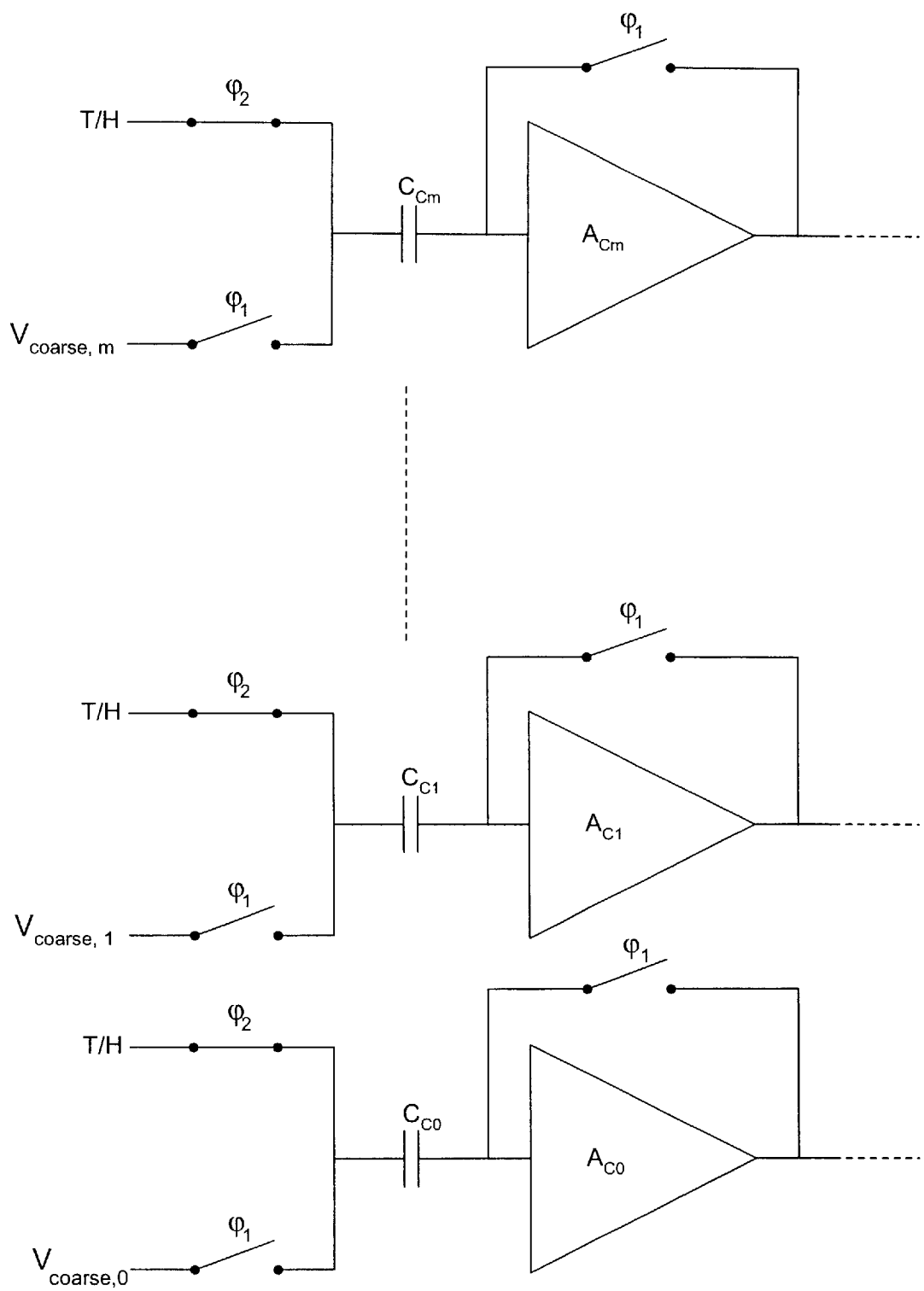
FIGS. 8 and 9 show the coarse and fine ADC's as amplifier arrays.

The digital output of the coarse ADC tells the fine ADC 105 which subrange from the reference ladder voltage $V_{ref}$ (i.e., $V_{fine}$) the switch matrix 103 should pass through to the fine ADC 105. Each amplifier amplifies only if there is a valid signal period. Here, the hold phase is the middle ⅓ phase of FIG. 5—both the coarse amplifier $A_C$ and the fine amplifier $A_F$ are looking at the signal. In a particular embodiment, an array of 30 coarse amplifiers and an array of 30 coarse comparators are used to get 31 subranges. The switch matrix 103 therefore connects to one out of 31 subranges. On the fine amplifier $A_F$ side, the embodiment includes an array of 19 A-stage amplifiers, an array of 33 B-stage amplifiers, an array of 65 C-stage amplifiers and an array of 65 D-stage amplifiers, as well as an array of 65 fine comparators. The coarse ADC 102 of the present invention is illustrated in array form in FIG. 8, showing a plurality of amplifiers $A_{C0}$–$A_{Cm}$, connected to a plurality of input capacitors $C_{C0}$, and through the input capacitors $C_{Cm}$ to a plurality of coarse taps from the reference ladder 104, taps $V_{coarse,0}$ to $V_{coarse,m}$. For 30 coarse amplifiers, m=29.

Figure 9:
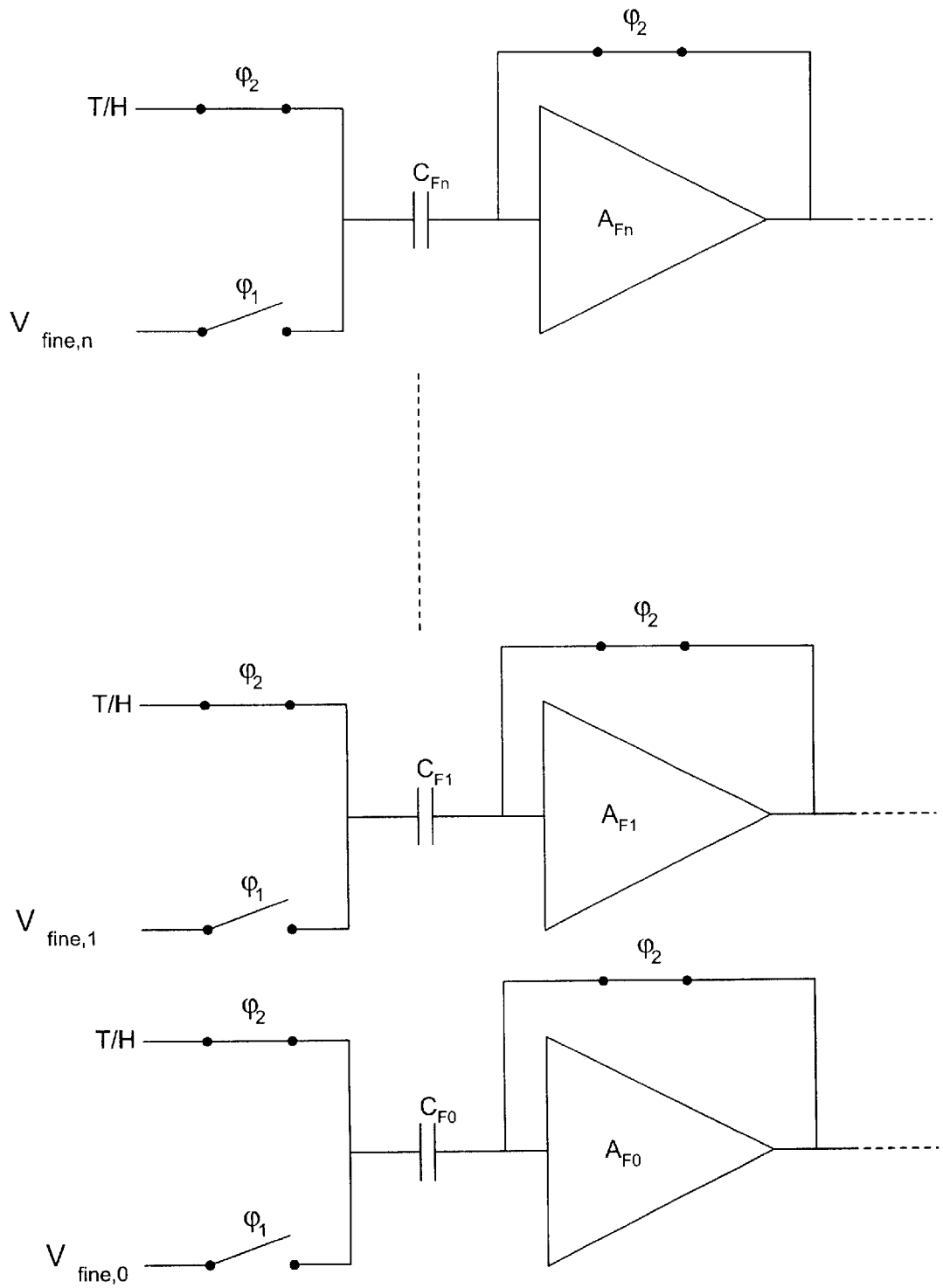

Similarly, the fine ADC 105 of the present invention is illustrated in array form in FIG. 9, showing a plurality of amplifiers $A_{F0}$–$AF_{Fn}$, connected to a plurality of input capacitors $C_{F0}$, and through the input capacitors $C_{Fn}$ to a plurality of fine taps from the reference ladder 104, taps $V_{fine,0}$ to $V_{fine,n}$. For 19 fine amplifiers, n=18. Note that although the auto-zero amplifiers $A_{C0}$–$A_{Cm}$ and $A_{F0}$–$A_{Fn}$ are shown as single ended in FIGS. 8 and 9, in actual application they are preferably differential amplifiers.

An "11 bit" output is actually converted to a 10-bit output, to compensate for conversion errors of the coarse ADC. With the approach of the present invention, there is no need to have to interleave ADC's running at ½ $F_{sample}$. Here, a single ADC can be run at $F_{sample}$, since there is delay of the latency of the fine ADC 105 by one half of a clock cycle.

Some timing refinements may be incorporated. The switches $S_1$, $S_2$ and $S_4$ shown on the left-side of the sampling capacitors $C_1$, $C_2$ in FIG. 2 can use slightly delayed clocks $\phi_{1d}$ and $\phi_{2d}$.

Furthermore, the coarse comparators 107 (CC) use an earlier clock signal $\phi_{1e}$, to give them somewhat more time to compare their input signal, thus improving their bit-error-rate. The switch $S_5$ connecting the fine amplifiers $A_F$ to the reference ladder 104 use a delayed clock, $\phi_{1dfine}$, for the same reason. Basically, this implements a three-phase clock to operate the coarse ADC 102.

The proposed timing can be applied to all subranging ADC's to improve the required power and area.

It will be appreciated that the various aspects of the invention as further disclosed in related application Ser. No. 10/153,709, Filed: May 24, 2002, Titled: Distributed Averaging Analog To Digital Converter Topology, Inventors: Mulder et al.; application Ser. No. 10/158,193, Filed: May 31, 2002; Titled: CLASS AB DIGITAL TO ANALOG CONVERTER/LINE DRIVER, Inventors: Jan Mulder et al.; application Ser. No. 10/158,595, Filed: May 31, 2002, Titled: HIGH SPEED ANALOG TO DIGITAL CONVERTER, Inventor: Jan Mulder; and Application Ser. No. 10/158,774, Filed: May 31, 2002, Inventor: Jan Mulder; Titled: ANALOG TO DIGITAL CONVERTER WITH INTERPOLATION OF REFERENCE LADDER, Inventor: Jan Mulder, all of which are incorporated by reference herein, may be combined in various ways, or be integrated into a single integrated circuit or product.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An N-bit analog to digital converter (ADC) comprising:
a reference ladder;
a track-and-hold amplifier tracking an input voltage with its output,
a coarse ADC amplifier connected to a coarse capacitor at its input and having a coarse ADC reset switch controlled by a first clock phase of a two-phase clock;
a fine ADC amplifier connected to a fine capacitor at its input and having a fine ADC reset switch controlled by a second clock phase of the two-phase clock, wherein the track-and-hold amplifier is in a hold-mode during the second clock phase;
a switch matrix that selects a voltage subrange from the reference ladder for use by the fine ADC amplifier based on an output of the coarse ADC amplifier,
wherein the coarse capacitor is charged to a coarse reference ladder voltage during the first clock phase and connected to the T/H output voltage during the second clock phase, and
wherein the fine capacitor is connected to a voltage subrange during the first clock phase and charged to the track-and-hold output voltage during the second clock phase; and
an encoder that converts outputs of the coarse and fine ADC amplifiers to an N-bit output.

2. The analog to digital converter of claim 1, wherein the coarse ADC reset switch is a field effect transistor (FET).

3. The analog to digital converter of claim 1, wherein the first and second clock phases are non-overlapping.

4. The analog to digital converter of claim 1, wherein the fine ADC amplifier includes a plurality of cascaded amplifier stages.

5. The analog to digital converter of claim 1, wherein the coarse ADC amplifier includes a plurality of cascaded amplifier stages.

6. The analog to digital converter of claim 1, wherein the coarse capacitor is connected to the track-and-hold amplifier output on a delayed second phase.

7. The analog to digital converter of claim 1, wherein the fine ADC capacitor is connected to the track-and-hold amplifier output on a delayed second clock phase and to the voltage subrange during a delayed first clock phase.

8. The analog to digital converter of claim 1, further including a switch that connects an output of the track-and-hold-amplifier to the coarse capacitor on the second clock phase.

9. The analog to digital converter of claim 1, further including a coarse comparator that latches the output of the coarse ADC amplifier and outputs it to the encoder.

10. The analog to digital converter of claim 1, further including a fine comparator that latches the output of the fine ADC amplifier and outputs it to the encoder.

11. An N-bit analog to digital converter comprising:
a reference ladder;
a track-and-hold amplifier tracking an input voltage;
a two-phase clock having phases $\phi_1$ and $\phi_2$;
a plurality of coarse ADC amplifiers each connected to a corresponding coarse capacitor at its input, wherein the coarse ADC amplifiers are reset on $\phi_1$ and their corresponding coarse capacitors are connected to an output of the track-and-hold on $\phi_2$, and wherein the track-and-hold amplifier is in a hold-mode on $\phi_2$;
a plurality of fine ADC amplifiers each connected to a corresponding fine capacitor at its input, wherein the fine ADC amplifiers are reset on $\phi_2$ and their corresponding fine capacitors are charged to the track-and-hold amplifier output voltage on $\phi_2$;

a switch matrix that selects a voltage subrange from the reference ladder, based on outputs of the coarse ADC amplifiers, for input to the fine ADC amplifiers on $\phi_1$; and an encoder that converts outputs of the coarse and fine ADC amplifiers to an N-bit output.

12. The analog to digital converter of claim 11, further including a FET switch that resets the coarse ADC amplifier on $\phi_1$.

13. The analog to digital converter of claim 11, wherein the $\phi_1$ and $\phi_2$ phases are non-overlapping.

14. The analog to digital converter of claim 11, wherein the fine ADC amplifiers include a plurality of cascaded amplifier stages.

15. The analog to digital converter of claim 11, wherein the coarse ADC amplifiers include a plurality of cascaded amplifier stages.

16. The analog to digital converter of claim 11, wherein the coarse capacitors are connected to the track-and-hold amplifier output on a delayed $\phi_2$.

17. The analog to digital converter of claim 11, wherein the fine capacitors are connected to the track-and-hold amplifier output on a delayed $\phi_2$, and to the voltage subrange on a delayed $\phi_1$.

18. The analog to digital converter of claim 11, further including switches that connect an output of the track-and-hold to the coarse capacitors on $\phi_2$.

19. The analog to digital converter of claim 11, further including a plurality of coarse comparators that latch the outputs of the coarse ADC amplifiers and output them to the encoder.

20. The analog to digital converter of claim 11, further including a plurality of fine comparators that latch the outputs of the fine ADC amplifiers and output them to the encoder.

21. An N-bit analog to digital converter comprising:

a reference ladder;

a track-and-hold amplifier tracking an input voltage;

a two-phase clock having phases $\phi_1$ and $\phi_2$;

a coarse capacitor connected to the track-and-hold amplifier on $\phi_2$ and to the reference ladder on $\phi_1$;

a coarse ADC amplifier that resets on $\phi_1$ and amplifies a voltage on the coarse capacitor on $\phi_2$;

a coarse comparator for latching an output of the coarse ADC amplifier on $\phi_{1+1\ cycle}$;

a fine capacitor connected to the track-and-hold on $\phi_2$ and to a fine voltage tap of the reference ladder on $\phi_1$, the fine voltage tap selected based on the output of the coarse ADC amplifier, wherein the track-and-hold amplifier is in a hold-mode on $\phi_2$;

a fine ADC amplifier including a plurality of cascaded amplifier stages, wherein a first cascaded amplifier stage resets on $\phi_2$ and amplifies a voltage on the fine capacitor on $\phi_{1+1cycle}$, a second cascaded amplifier stage resets on $\phi_{1+1cycle}$ and amplifies the voltage on the fine capacitor on $\phi_{2+1\ cycle}$, a third cascaded amplifier stage resets on $\phi_{2+1cycle}$ and amplifies the voltage on the fine capacitor on $\phi_{1+2\ cycles}$, and so on;

a fine comparator for latching an output of a last cascaded amplifier stage; and an encoder converting outputs of the coarse and fine comparators to an N-bit output.

22. The analog to digital converter of claim 21, wherein the phases $\phi_1$ and $\phi_2$ are non-overlapping.

23. The analog to digital converter of claim 21, wherein the coarse capacitor connects to the track-and-hold on a delayed $\phi_2$.

24. The analog to digital converter of claim 21, wherein the fine ADC capacitor is connected to the track-and-hold on a delayed $\phi_2$ and to the fine voltage tap on a delayed $\phi_1$.

25. The analog to digital converter of claim 21, further including a FET switch that connects the track-and-hold amplifier to the coarse capacitor on $\phi_2$.

26. The analog to digital converter of claim 21, further including a coarse comparator that latches the output of the coarse ADC amplifier and outputs it to the encoder.

27. The analog to digital converter of claim 21, further including a fine comparator that latches the output of the fine ADC amplifier and outputs it to the encoder.

28. An N-bit analog to digital converter comprising:

a reference ladder;

a track-and-hold amplifier tracking an input voltage;

a two-phase clock having alternating phases $\phi_1$ and $\phi_2$;

a plurality of coarse capacitors connected to an output of the track-and-hold on $\phi_2$ and to corresponding coarse taps of the reference ladder on $\phi_1$;

a plurality of coarse ADC amplifiers that reset on $\phi_1$ and amplify voltages on the coarse capacitors on $\phi_2$;

a plurality of coarse comparators for latching outputs of the coarse ADC amplifiers;

a plurality of fine capacitors connected to the output of track-and-hold amplifier on $\phi_2$ and connected to fine voltage taps of the reference ladder on $\phi_1$, the fine voltage taps selected based on the outputs of the coarse ADC amplifiers, wherein the track-and-hold amplifier is in a hold-mode on $\phi_2$;

a plurality of fine ADC amplifiers, each including a plurality of cascaded amplifier stages, wherein the cascaded amplifier stages reset and amplify on alternating phases $\phi_1$ and $\phi_2$, wherein amplifiers of the first stage are reset on $\phi_2$ and amplify voltages of the fine capacitors on $\phi_1$;

a plurality of fine comparators for latching outputs of a last amplifier stage; and an encoder converting outputs of the coarse and fine comparators to an N-bit output.

29. The analog to digital converter of claim 28, wherein the $\phi_1$ and $\phi_2$ phases are non-overlapping.

30. The analog to digital converter of claim 28, wherein the fine capacitors are connected to the output of the track-and-hold amplifier during a delayed $\phi_2$ and to the fine voltage taps on a delayed $\phi_1$.

31. The analog to digital converter of claim 28, further including a plurality of switches that connect the output of the track-and-hold to the coarse capacitors on $\phi_2$.

32. An N-bit analog to digital converter comprising:

a two-phase clock having phases $\phi_1$ and $\phi_2$;

a reference ladder;

a track-and-hold amplifier tracking an input voltage;

a coarse ADC amplifier that resets on $\phi_1$ and amplifies a difference of an output of the track-and-hold amplifier and a coarse tap of the reference ladder on $\phi_2$, wherein the track-and-hold amplifier is in a hold-mode on $\phi_2$;

a fine ADC amplifier that resets on $\phi_2$ and amplifies a difference of the output of the track-and-hold amplifier and a fine tap of the reference ladder on $\phi_1$;

a switch matrix that selects a voltage subrange from the reference ladder for use by the fine ADC amplifier based on an output of the coarse ADC amplifier; and an encoder that converts outputs of the coarse and fine ADC amplifiers to an N-bit output.

33. A method of converting analog to digital voltage comprising the steps of:

resetting a coarse ADC amplifier on the first clock phase;

charging a coarse capacitor to a first reference voltage during a first clock phase of a two phase clock;

connecting the coarse capacitor to an input voltage during a second clock phase of the two phase clock;

wherein the T/H amplifier is in hold-mode during the $2^{nd}$ clock phase;

selecting the second reference voltage based on an output of the coarse ADC amplifier;

connecting a fine capacitor to a second reference voltage during the first clock phase;

charging the fine capacitor to the input voltage during the second clock phase;

amplifying a voltage on the coarse capacitor on the second clock phase;

resetting a fine ADC amplifier on the second clock phase;

amplifying a voltage of the fine capacitor on the first clock phase; and converting outputs of the coarse and fine ADC amplifiers to an N-bit output.

34. A method of converting analog to digital voltage comprising the steps of:

on a first clock phase, charging a coarse capacitor to a first reference voltage, connecting a fine capacitor to a second reference voltage, resetting a coarse ADC amplifier, and amplifying a voltage of the fine capacitor;

on a second clock phase, connecting the coarse capacitor to an output of a track-and-hold amplifier, setting the track-and-hold amplifier to a hold mode, charging the fine capacitor to the input voltage, resetting a fine ADC amplifier, selecting a voltage subrange from the reference ladder for use by the fine ADC amplifier based on an output of the coarse ADC amplifier; and converting outputs of the coarse and fine ADC amplifiers to an N-bit output.

\* \* \* \* \*